United States Patent
Choi

(10) Patent No.: US 7,463,064 B2
(45) Date of Patent: Dec. 9, 2008

(54) LEVEL SHIFTER HAVING EXTENDED INPUT LEVEL

(75) Inventor: Seouk-Kyu Choi, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 59 days.

(21) Appl. No.: 11/346,889

(22) Filed: Feb. 2, 2006

(65) Prior Publication Data
US 2006/0170454 A1 Aug. 3, 2006

(30) Foreign Application Priority Data
Feb. 2, 2005 (KR) .................. 10-2005-0009681

(51) Int. Cl.
*H03K 19/0175* (2006.01)
*H03L 5/00* (2006.01)
(52) U.S. Cl. .............................. 326/68; 326/63; 327/333
(58) Field of Classification Search ............... 326/62, 326/63, 68, 80, 81, 82, 86; 327/333
See application file for complete search history.

(56) References Cited

U.S. PATENT DOCUMENTS 6,064,229 A * 5/2000 Morris ................... 326/81
7,068,091 B1 * 6/2006 Kwong .................. 327/333
2004/0160262 A1 * 8/2004 Kim et al. ............... 327/333
2005/0275430 A1 * 12/2005 Kim et al. ................ 326/81

FOREIGN PATENT DOCUMENTS

| JP | 2001-351393 | 12/2001 |
| JP | 2004-153446 | 5/2004 |
| KR | 1998-039608 | 8/1998 |

OTHER PUBLICATIONS

English language abstract of Korean Publication No. 1998-039608.
English language abstract of Japanese Publication No. 2001-351393.
English language abstract of Japanese Publication No. 2004-153446.

* cited by examiner

*Primary Examiner*—Rexford Barnie
*Assistant Examiner*—Thienvu V Tran
(74) *Attorney, Agent, or Firm*—Marger Johnson & McCollom, P.C.

(57) ABSTRACT

A level shifter for level shifting an input signal from a first level to an output signal having a second level includes an operation range extension portion configured to extend an input range of the level shifter and to generate a first extension control signal in response to the input signal and a second extension control signal in response to an inverted version of the input signal, an output control portion configured to generate an output control signal in response to the input signal, the first extension control signal, and the output signal, and an output portion configured to generate the output signal in response to the inverted version of the input signal, the second extension control signal, and an output control signal.

20 Claims, 4 Drawing Sheets

LEVEL SHIFTER HAVING EXTENDED INPUT LEVEL

CROSS-REFERENCE TO RELATED PATENT APPLICATIONS

This application claims the benefit of Korean Patent Application No. 10-2005-0009681, filed on Feb. 2, 2005, in the Korean Intellectual Property Office, the disclosure of which is incorporated herein in its entirety by reference.

BACKGROUND OF THE INVENTION

1. Field of the Invention

This disclosure relates to a level shifter having an extended input level, and more particularly, to a level shifter which can operate in response to an input signal of a low level by allowing an output portion and an output control portion to operate in direct response to the input signal.

2. Description of the Related Art

FIG. 1 is a circuit diagram of a conventional level shifter. Referring to FIG. 1, a level shifter 100 in response to input signal IN, having first level or ground level values outputs output signal OUT having a value shifted to a second level or the ground level.

In the operation of the level shifter 100, the first level value is equivalent to a first power voltage Vcc and the second level value is equivalent to a second power voltage Vpp. The level shifter 100 includes a first control transistor P1, a second control transistor N1, a first output transistor P2, a second output transistor N2, and an inverter INV. The first control transistor P1 and the first output transistor P2 are PMOS transistors while the second transistor N1 and the second output transistor N2 are NMOS transistors.

When the input signal IN has the ground level value, the second control transistor N1 is turned off and an inverted input signal INB that is obtained as the input signal IN is inverted is input to a gate of the second output transistor N2. Thus, the second output transistor N2 is turned on in response to the inverted input signal INB and the output signal OUT has the ground level value.

The first control transistor P1 is turned on in response to the output signal OUT having the ground level value and the voltage Vpp of the second level is supplied to a gate of the first output transistor P2. Thus, the first output transistor P2 is turned off in response to the voltage Vpp of the second level.

Next, when the input signal IN has the first level Vcc value, the second control transistor N1 is turned on and the voltage of the ground level is supplied to a gate of the first output transistor P2. Thus, the first output transistor P2 is turned on in response to the ground level voltage so that the output signal OUTPUT has the second level Vpp value.

The second output transistor N2 is turned off in response to the inverted input signal INB. The first control transistor P1 is turned off in response to the output signal OUT having the second level Vpp value. That is, when the input signal IN having the ground level value is input, the second output transistor N2 and the first control transistor P1 are turned on and the level shifter 100 outputs the output signal OUT having the ground level value. Also, when the input signal IN having the first level Vcc value is input, the first output transistor P2 and the second control transistor N1 are turned on and the level shifter 100 outputs the output signal OUT having a value that is shifted to the second level Vpp value.

As described above, when the level shifter 100 outputs the shifted output signal OUT, in either case of the input signal IN having the first level Vcc value or the ground level value, two transistors are turned on.

However, there is a demand for semiconductor integrated circuits consuming less electric power. Accordingly, the voltage level of an input signal is decreased. However, in the conventional level shifter, since the level of the input signal is shifted by the operation of two transistors being turned on, as the voltage level of the input signal decreases, the speed at which the input signal is shifted decreases and eventually the level shifting cannot be performed with respect to an input signal having a voltage level not greater than a predetermined voltage.

When the input level is shifted from the first level Vcc to the ground level in the conventional level shifter 100, the second output transistor N2 is turned on in response to the input signal IN. However, the first output transistor P2 is turned off in response to the operation of the first control transistor P1 that operates in response to the output signal OUT. Thus, both of the first output transistor P2 and the second output transistor N2 are turned on.

Similarly, when the level of the input signal is shifted from the ground level to the first level Vcc, both of the first control transistor P1 and the second control transistor N1 are turned on. That is, in the conventional level shifter 100, since both first output transistor P2 and second output transistor N2, and both first control transistor P1 and second control transistor N1, are turned on at the moment when the level of the input signal IN is shifted, a current path is formed from the second level Vpp to the ground level so that the transistors are deteriorated.

SUMMARY OF THE INVENTION

An embodiment includes a level shifter for level shifting an input signal from a first level to an output signal having a second level including an operation range extension portion configured to extend an input range of the level shifter and to generate a first extension control signal in response to the input signal and a second extension control signal in response to an inverted version of the input signal, an output control portion configured to generate an output control signal in response to the input signal, the first extension control signal, and the output signal, and an output portion configured to generate the output signal in response to the inverted version of the input signal, the second extension control signal, and an output control signal.

Another embodiment includes a level shifter including a first level shift portion and a second level shift portion. The first level shift portion is configured to pull up an output node in response to an input signal and includes a first control transistor coupled to a ground and a control node, and responsive to the input signal, a first output transistor coupled to a first power supply and the output node, and responsive to a first extension control signal, and a first extension transistor configured to generate the first extension control signal in response to an inverted input signal. The second level shift portion is configured to pull down an output node in response to an input signal and includes a second control transistor coupled to the first power supply and the control node, and responsive to an output signal on the output node and a second extension control signal, a second extension transistor configured to generate the second extension control signal in response to the input signal, and a second output transistor coupled to the ground and the output node, and responsive to the inverted input signal.

A further embodiment includes a level shifter including a first control transistor having a source coupled to a ground and a gate to receive an input signal, a second control transistor having a source coupled to a power supply, a ground coupled to a drain of the first control transistor, and a gate coupled to an output node, an inverter to generate an inverted input signal in response to the input signal, a first output transistor having a source coupled to the ground, a drain coupled to the output node, and a gate to receive the inverted input signal, a second output transistor having a source coupled to the power supply, a drain coupled to the output node, and a gate coupled to the drain of the second control transistor, a first extension transistor having a gate coupled to a second power supply, a drain coupled to the gate of the second control transistor, and a source coupled to the gate of the first control transistor, and a second extension transistor having a gate coupled to the second power supply, a drain coupled to the gate of the second output transistor, and a source coupled to the gate of the first output transistor.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
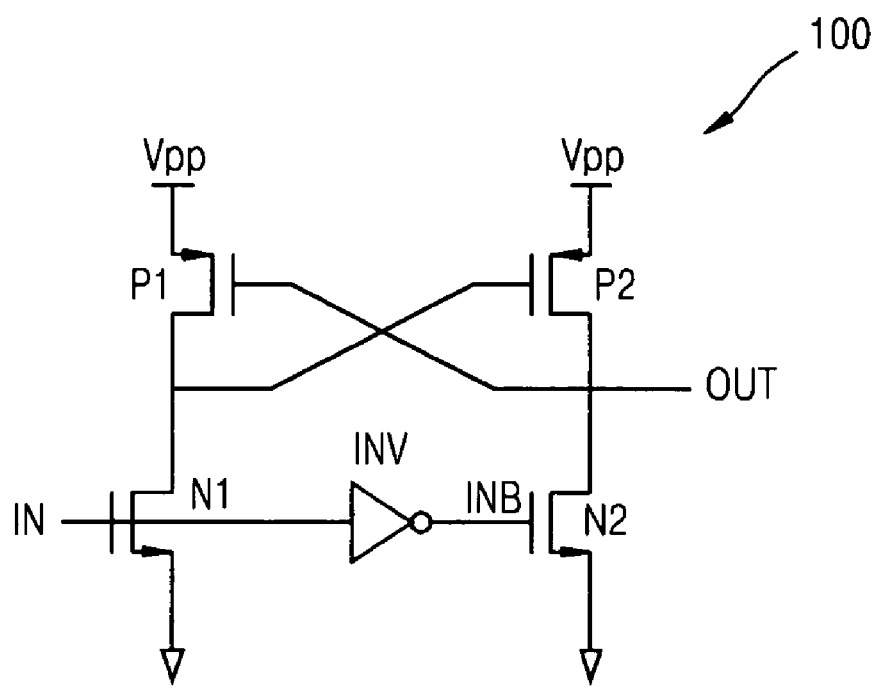
FIG. 1 is a circuit diagram of a conventional level shifter.

Hereinafter, embodiments are described with reference to the accompanying drawings. In the drawings, the same reference numerals indicate the same constituent elements having the same functions.

Figure 2:
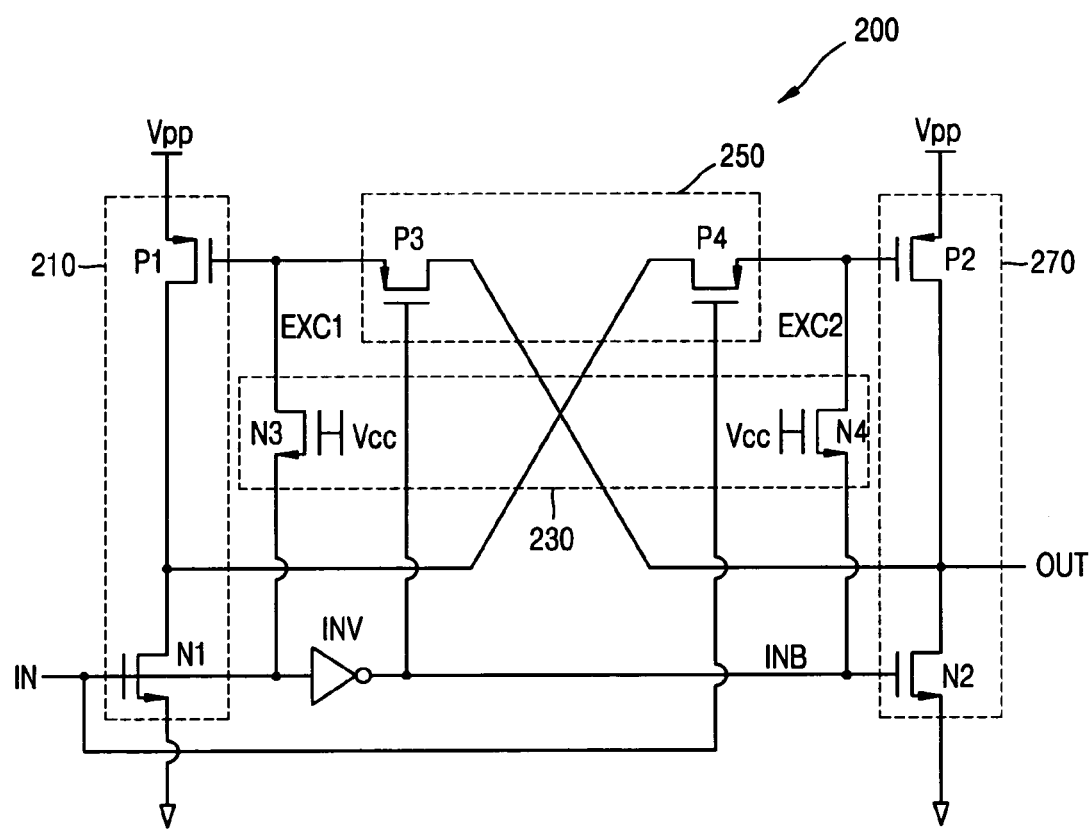
FIG. 2 is a circuit diagram of a level shifter according to an embodiment of the invention.

FIG. 2 is a circuit diagram of a level shifter according to an embodiment of the invention. Referring to FIG. 2, a level shifter 200 receives an input signal IN having a first level Vcc or a ground level and outputs an output signal OUT having values shifted to a second level Vpp or the ground level. The level shifter 200 includes an output control portion 210, an operation range extension portion 230, and an output portion 270. The level shifter 200 may further include an output level auxiliary portion 250.

The operation range extension portion 230 in response to a power voltage having a first level Vcc value provides a first extension control signal EXC1 and a second extension control signal EXC2 to the output control portion 210 and the output portion 270, respectively, to extend the range of the voltage level of the input signal IN. That is, a shifted output signal OUT can be output with respect to the input signal IN having a low level value.

The operation range extension portion 230 includes a first extension transistor N3 and a second extension transistor N4. The first extension transistor N3 is coupled between the gate of the first control transistor P1 and a gate of the second control transistor N1. The first extension transistor N3 operates in response to a power voltage having a first level Vcc value and provides the first extension control signal EXC1 to the first control transistor P1 in response to the input signal IN.

That is, the first extension transistor N3 outputs the first extension control signal EXC1 of the same logic level as that of the input signal IN to assist the turn-on or turn-off operation of the first control transistor P1 so as to reduce DC current flowing in the first control transistor P1. Also, the first extension transistor N3 facilitates level shifting operation with respect to a low input signal IN.

The second extension transistor N4 is coupled between the gate of the first output transistor P2 and the gate of the second output transistor N2. The second extension transistor N4 operates in response to the power voltage having a first level Vcc value and provides the second extension control signal EXC2 to the first output transistor P2 in response to an inverted input signal INB.

Similar to the first extension transistor N3, the second extension transistor N4 outputs the second extension control signal EXC2 of the same logic level as that of the inverted input signal INB to assist the turn-on or turn-off operation of the first output transistor P2 so as to reduce DC current flowing in the first output transistor P2. In addition, the second extension transistor N4 facilitates level shifting operation with respect to the low input signal IN.

The first and second extension transistors N3 and N4 are turned on in response to the power voltage having the first level Vcc value. The threshold voltages Vt2 of the first and second extension transistors N3 and N4 may be identical with each other. In addition, the level of the first extension control signal EXC1 is higher than that of the input signal IN by the threshold voltage Vt2 of the first extension transistor N3. The level of the second extension control signal EXC2 is higher than that of the inverted input signal INB by the threshold voltage Vt2 of the second extension transistor N4.

The output control portion 210 controls the output level of the output portion 270 in response to the input signal IN and the first extension control signal EXC1. The output control portion 210 includes the first control transistor P1 and the second control transistor N1. An end of the first control transistor P1 is coupled to the power voltage Vpp having the second level value to operate in response to the first extension control signal EXC1. The second control transistor N1 is coupled between the other end of the first control transistor P1 and the ground voltage to operate in response to the input signal IN.

The output portion 270 generates a shifted output signal OUT in response to the inverted input signal INB and the second extension control signal EXC2. The output portion 210 includes the first output transistor P2 and the second output transistor N2. An end of the first output transistor P2 is coupled to the power voltage Vpp having the second level value to pull up an output end to the second level Vpp value in response to the second extension output signal EXC2. The second output transistor N2 is coupled between the other end of the first output transistor P2 and the ground voltage to pull down the output end in response to the inverted input signal INB.

Unlike the conventional level shifter, the level shifter 200 according to this embodiment uses the first and second extension transistors N3 and N4 having gate oxide films whose widths are thinner than those of the first and second control transistors P1 and N1 and the first and second output transistors P2 and N2. In general, as the thickness of the gate oxide film decreases, a threshold voltage Vt of a transistor decreases. Thus, in the present embodiment, when being turned on, the first and second extension transistors N3 and N4 have lower critical voltage values. In other words, Vt>Vt2, where Vt is the threshold voltage of the control and output transistors, P1, N1, P2, and N2, and Vt2 is the threshold voltage of the extension transistors N3 and N4.

The first output transistor P2 operates in response to an inverted level of the input signal IN coupled though the second extension transistor N4 that is turned on. The first control transistor P1 operates in response to the level of the input signal IN connected through the first extension transistor N3.

When the output signal OUT, shifted to the second level, is output in response to the input signal IN having the first level value, the second extension transistor N4 is turned on so that the first output transistor P2 is turned on. When the output signal OUT having the ground level value is output in response to the input signal IN having the ground level value, the first extension transistor N3 is turned on so that the first control transistor P1 is turned on.

To the contrary, in the conventional level shifter, the first output transistor P2 is turned on by turning on the first control transistor N1 or the first control transistor P1 is turned on by turning on the second output transistor N2.

In the level shifter 200 since the first control transistor P1 and the first output transistor P2 operate in direct response to the input signal IN, the level shifter 200 can perform a level shift operation with respect to a lower input signal and a lower voltage level.

The level shifter 200 according to the present embodiment may further include an output level auxiliary portion 250 for controlling connection with an output end during transition of the input signal IN by compensating for the levels of the first and second extension control signals EXC1 and EXC2 provided from the operation range extension portion 230. The output level auxiliary portion 250 assists the level of the output signal OUT before and after the transition of the input signal IN by controlling the connection between the output portion 270 and the output control portion 210 during the transition of the input signal IN.

Referring to FIG. 2, the output level auxiliary portion 250 includes a first compensation transistor P3 and a second compensation transistor P4. The first compensation transistor P3 is coupled between the first control transistor P1 and the output end. The second compensation transistor P4 is coupled between the gate of the first output transistor P2 and a drain of the first control transistor P1.

The first compensation transistor P3 assists the turn-off operation of the first control transistor P1 by controlling the connection between the output portion 270 and the first control transistor P1 during the transition of the input signal IN in response to the inverted input signal INB to compensate for the voltage level of the first extension control signal EXC1.

The second compensation transistor P4 assists the turn-off operation of the first output transistor P2 by controlling the connection between the output control portion 210 and the first output transistor P2 during the transition of the input signal IN in response to the input signal IN to compensate for the voltage level of the second extension control signal EXC2.

When the input signal IN has the first level value, the second compensation transistor P4 is turned off in response to the input signal IN to cut the connection between the output control portion 210 and the first output transistor P2 so that the first compensation transistor P3 in response to the inverted input signal INB allows the output end having the second level value to connect to the gate of the first control transistor P1. Thus, the first control transistor P1 is turned off in response to not only the first extension control signal EXC1 having a high level value but also the second level value from the output end.

When the input signal IN has the ground level value, the first compensation transistor P3 is turned off in response to the inverted input signal INB to cut the connection between the output end and the first control transistor P1. Also, the second compensation transistor P4 is turned on in response to the input signal IN so and allows the drain of the first control transistor P1, having the second level value, to connect to the gate of the first output transistor P2. Thus, the first output transistor P2 is turned off in response to not only the second extension control signal EXC2 having a high level value but also the second level value from the drain of the first control transistor P1.

When the input signal IN transitions from the first level value to the ground level value, the first compensation transistor P3 changes into a turn-off state from a turn-on state to cut the connection between the output portion 270 and the first control transistor P1. In addition, the second compensation transistor P4 changes into a turn-on state from a turn-off state to cut the connection between the drain of the first control transistor P1 and the gate of the first output transistor P2.

When the input signal IN is transitions from the ground level value to the first level value, the first compensation transistor P3 changes into a turn-on state from a turn-off state so that the output end is connected to the first control transistor P1. In addition, the second compensation transistor P4 changes into a turn-off state from a turn-on state to cut the connection between the drain of the first control transistor P1 and the gate of the first output transistor P2.

That is, the first and second compensation transistors P3 and P4 control the connection between the output portion 270 and the output control portion 210 to prevent unnecessary DC current that may flow through the first control transistor P1 or the first output transistor P2 during the transition of the input signal IN and allow the output end to rise or fall after the input signal IN is transited.

Figure 3:
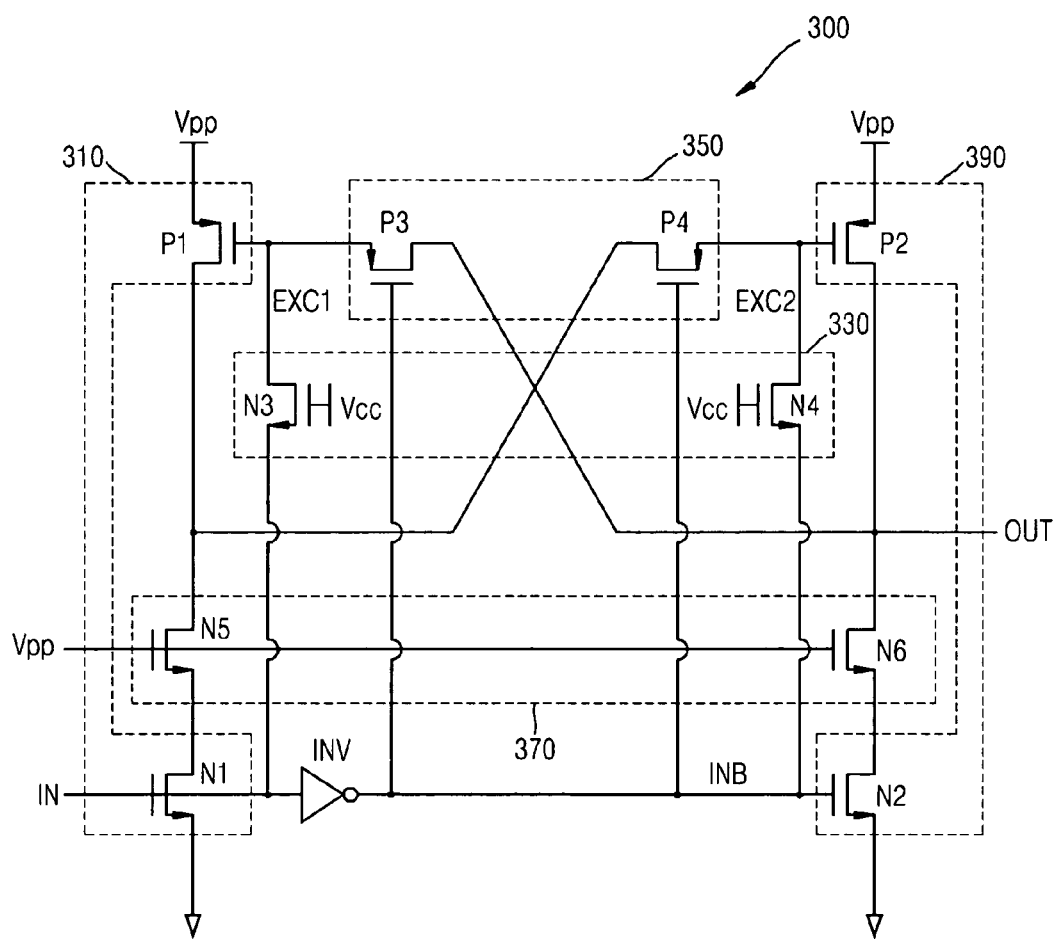
FIG. 3 is a circuit diagram of a level shifter according to another embodiment of the invention.

FIG. 3 is a circuit diagram of a level shifter according to another embodiment. Referring to FIG. 3, a level shifter 300 includes a deterioration prevention portion 370 for preventing a deterioration of an output control portion 310 and an output portion 390 by being instantly short-circuited.

The deterioration prevention portion 370 includes a first deterioration prevention transistor N5 and a second deterioration prevention transistor N6. The first deterioration prevention transistor N5 is coupled in series between the first control transistor P1 and the second control transistor N1 and operates in response to a power voltage VB having a predetermined level value. In this embodiment, the voltage level of the power voltage VB may be the first level Vcc or second level Vpp, however, the voltage level is not limited to those values. The second deterioration prevention transistor N6 is connected in series between the first output transistor P2 and the second output transistor N2 and operates in response to the power voltage VB having a predetermined level value. The operation of the deterioration prevention portion 370 is described below.

When the voltage level of the input signal IN is transitions from a low level to a high level, a phenomenon in which the first and second control transistors P1 and N1 are simultaneously turned on occurs. In addition, when the voltage level of the input signal IN is transitions from a high level to a low level, a phenomenon in which the first and second output transistors P2 and N2 are simultaneously turned on occurs. In these cases, current path is formed from the power voltage having the second level Vpp to the ground voltage so that a deterioration phenomenon occurs in the operation of the transistors.

The first and second deterioration prevention transistors N5 and N6 reduce the deterioration due to the formation of the current path. That is, the current of the current path through the first and second control transistors P1 and N1 can be reduced by making the first deterioration prevention transistor N5 always turned on in response to the power voltage having the second level Vpp value. Similarly, current of the current path through the first and second output transistors P2 and N2 can be reduced by making the second deterioration prevention transistor N6 always turned on in response to the power voltage having the second level Vpp value.

The thicknesses of the gate oxide films of the second control transistor N1 and the second output transistor N2 are thinner than those of the gate oxide films of the first and second deterioration prevention transistors N5 and N6. That is, the deterioration phenomenon due to the instant short circuit is reduced by thickening the gate oxide films of the first and second deterioration prevention transistors N5 and N6. In addition, the deterioration in the operation speed of the level shift circuit can be reduced by thinning the gate oxide films of the second control transistor N1 and the second output transistor N2 that perform the level shift operation.

A level shifter according to another embodiment of the present invention includes a first level shift portion and a second level shift portion. The first level shift portion outputs an output signal having the second level value in response to an input signal having the first level value. The second level shift portion generates an output signal having a ground level value in response to an input signal having the ground level value.

Referring to FIGS. 2 and 3, a level shifter according to this embodiment is described. The first level shift portion includes the first control transistor N1, the first extension transistor N4, and a first output transistor P2. The first control transistor N1 is connected to the ground voltage and controls the output level of the output signal OUT in response to the input signal IN.

The first extension transistor N4 operates in response to the power voltage having the first level Vcc value and extends the range of the operation voltage level of the input signal IN by providing the first extension control signal EXC2 in response to the inverted input signal INB. That is, the first extension transistor N4 outputs the first extension control signal EXC2 having the same level as that of the inverted input signal INB to assist the turn-on or turn-off operation of the first output transistor P2 so as to reduce the DC current flowing through the first output transistor P2. In addition, the first extension transistor N4 facilitates level shifting operation with respect to the low input signal IN. The first output transistor P2 is connected to the power voltage having the second level Vpp value and pulls up the output signal out to the second level Vpp value in response to the first extension control signal EXC2.

The second level shift portion includes the second control transistor P1, the second extension transistor N3, and the second output transistor N2. The second control transistor P1 is connected to the power voltage having the second level Vpp value and controls the output level of the output signal OUT in response to the second extension control signal EXC1.

The second extension transistor N3 operates in response to the power voltage having the first level Vcc value and extends the range of the operation voltage level of the input signal IN by providing the second extension control signal EXC1 in response to the input signal IN. That is, the second extension transistor N4 outputs the second extension control signal EXC1 having the same logic level as that of the input signal IN to assist the turn-on or turn-off operation of the second control transistor P1 so as to reduce the DC current flowing through the second control transistor P1. Also, the second extension transistor N3 facilitates a level shifting operation with respect to the low input signal IN. The second output transistor N2 is connected to the ground voltage and pulls down the output signal out to the ground level value in response to the inverted input signal INB.

In the level shifter according to another embodiment, the thicknesses of the gate oxide films of the first and second extension transistors N4 and N3 are thinner than those of the gate oxide films of the first and second output transistors P2 and N2. Thus, the range of the operation voltage level of the input signal IN of the level shifter is extended.

The first level shift portion may further include the first compensation transistor P4 which is coupled between the gate of the first output transistor P1 and the drain of the first control transistor N1 and controls the connection between the output control portion 210 and the first output transistor P2 during the transition of the input signal IN in response to the input signal IN to compensate for the level of the first extension control signal EXC2 and assist the turn-off operation of the first output transistor P2.

The first level shift portion may further include the first deterioration prevention transistor N5 which is coupled between the first control transistor N1 and the second control transistor P1 and reduces the deterioration phenomenon due to the instant short circuit of both first and second control transistors N1 and P1, in response to the power voltage having a predetermined level value. The voltage level of the power voltage VB may be equivalent to the first or second level Vcc or Vpp, however, the power voltage VB is not limited thereto.

The second level shift portion may further include the second compensation transistor P3 which is coupled between the gate of the second control transistor P1 and the output end and controls the connection between the output control transistor P1 and the output end during the transition of the input signal IN in response to the inverted input signal INB to compensate for the level of the second extension control signal EXC1 and assist the turn-off operation of the second control transistor P1.

The second level shift portion may further include the second deterioration prevention transistor N6 which is connected between the first output transistor P2 and the second output transistor N2 and reduces the deterioration phenomenon due to the instant short circuit of both first and second output transistors P2 and N2, in response to the power voltage having a predetermined level value. The voltage level of the power voltage VB may be equivalent to the first or second level Vcc or Vpp, however, the power voltage VB is not limited thereto.

In the level shifter according to another embodiment the thicknesses of the gate oxide films of the first control transistor N1 and the second output transistor N2 are thinner than those of the gate oxide films of the first and second deterioration prevention transistors N5 and N6. Thus, the operation speed of the level shifter is reduced.

Since the operation of the level shifter according to these other embodiments is substantially the same as that of the level shifter 200 shown in FIGS. 2 and 3, the detailed description of the operation will be omitted herein.

Figure 4:
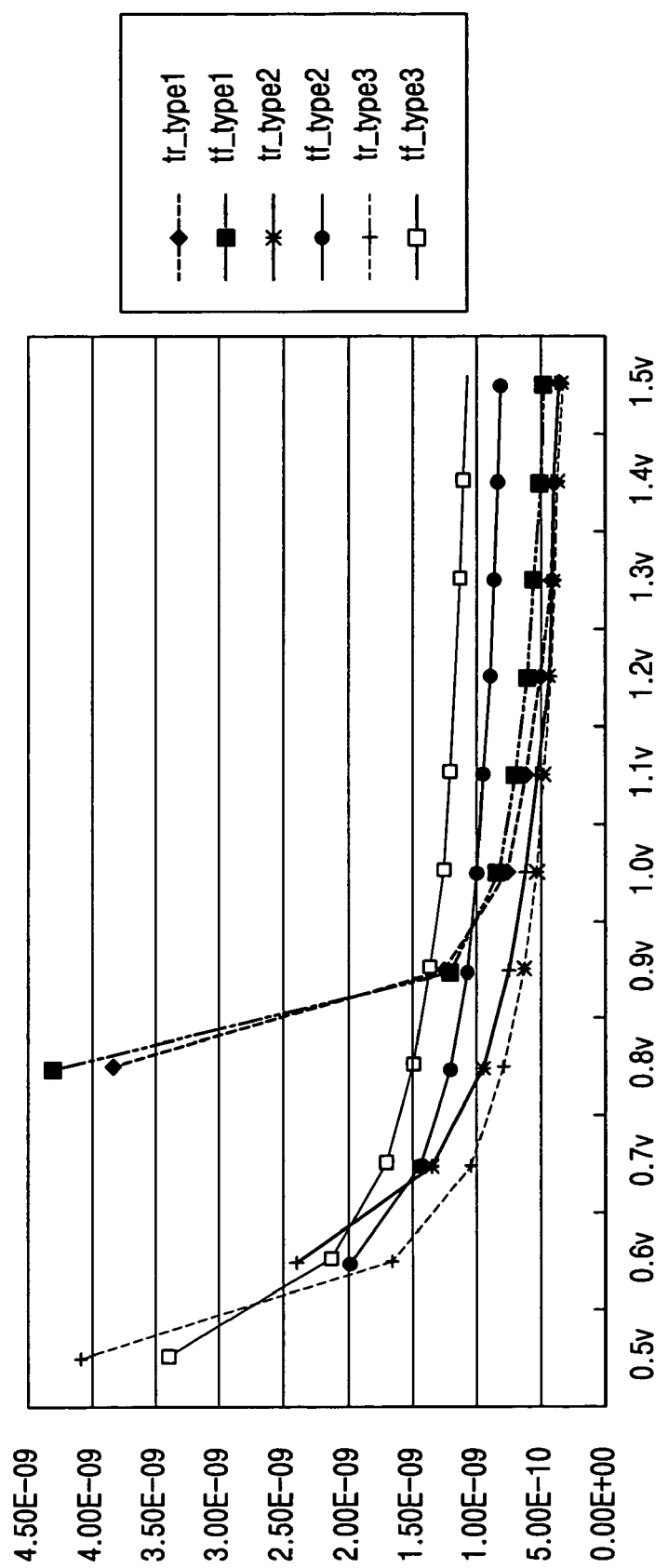
FIG. 4 is a graph showing the result of simulation of the level shifter according to embodiments of the invention.

FIG. 4 is a graph showing the result of simulation of the rising and falling time of the conventional level shifter and the level shifters according to the embodiments of the present invention. Referring to FIG. 4, the rising time and the falling time of the conventional level shifter 100 are indicated as tr_type1 and tf_13 type1, respectively, the rising time and the falling time of the level shifter 200 shown in FIG. 2 are indicated as tr_type2 and tf_type2, respectively, and the rising time and the falling time of the level shifter 300 shown in FIG. 3 are indicated as tr_type3 and tf_type3, respectively. In FIG. 4, the horizontal axis indicates the level V of the input signal IN while the vertical axis indicates the rising or falling time (sec). As shown in FIG. 4, compared to the conventional level shifter 100, the level shifters 200a and 300 according to the embodiments of the present invention operate with respect to a lower level input voltage Vcc without the reduction in the operation speed.

As described above, the level shifter according to embodiments can perform the level shift with respect to an input signal having a low voltage level value. Accordingly, the operation voltage level of the input signal is extended to a lower voltage level.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A level shifter for level shifting an input signal from a first level to an output signal having a second level, the level shifter comprising:
    an operation range extension portion configured to extend an input range of the level shifter and to generate a first extension control signal in response to the input signal and a second extension control signal in response to an inverted version of the input signal;
    an output control portion configured to generate an output control signal in response to the input signal, the first extension control signal, and the output signal; and
    an output portion configured to generate the output signal in response to the inverted version of the input signal, the second extension control signal, and the output control signal;
    wherein the operation range extension portion includes:
        a first extension transistor configured to generate the first extension control signal in response to a first power supply having the first level and the input signal; and
        a second extension transistor configured to generate the second extension control signal in response to the first power supply having the first level and the inverted input signal.

2. The level shifter as claimed in claim 1, wherein the output control portion comprises:
    a first control transistor coupled to a power supply having the second level and responsive to the first extension control signal and the output signal; and
    a second control transistor coupled between the first control transistor and a ground and responsive to the input signal.

3. The level shifter as claimed in claim 1, wherein the output portion comprises:
    a first output transistor coupled to a power supply having the second level and configured to pull up an output node to the second level in response to the second extension control signal and the output control signal; and
    a second output transistor coupled between the first output transistor and a ground and configured to pull down the output node in response to the inverted input signal.

4. The level shifter as claimed in claim 1, wherein thicknesses of gate oxide films of the first and second extension transistors are thinner than thicknesses of gate oxide films of transistors of the output portion and the output control portion.

5. The level shifter as claimed in claim 1, further comprising an output level auxiliary portion configured to selectively couple the output control signal to the output portion and the output signal to the output control portion in response to the input signal.

6. The level shifter as claimed in claim 5, wherein the output level auxiliary portion comprises:
    a first compensation transistor configured to couple the output signal to the output control portion in response to the inverted input signal; and
    a second compensation transistor configured to couple the output control signal to the output portion in response to the input signal.

7. The level shifter as claimed in claim 1, further comprising a deterioration prevention portion configured to reduce a first current flowing through the output control portion and a second current flowing through the output portion.

8. The level shifter as claimed in claim 7, wherein the deterioration prevention portion comprises:
    a first deterioration prevention transistor coupled between a first control transistor and a second control transistor of the output control portion and coupled to a power supply having a predetermined level; and
    a second deterioration prevention transistor coupled between a first output transistor and a second output transistor of the output portion and coupled to the power supply.

9. The level shifter as claimed in claim 8, wherein the predetermined level is one of the first level and the second level.

10. The level shifter as claimed in claim 8, wherein thicknesses of gate oxide films of the second control transistor and the second output transistors are thinner than thicknesses of gate oxide films of the first and second deterioration prevention transistors.

11. The level shifter as claimed in claim 1, wherein:
    the output control portion is configured to generate the output control signal in direct response to the input signal; and
    the output portion is configured to generate the output signal in direct response to the inverted version of the input signal.

12. A level shifter for level shifting an input signal from a first level to an output signal having a second level, the level shifter comprising:
    a first level shift portion configured to pull up an output node in response to an input signal including:
        a first control transistor coupled to a ground and a control node, and responsive to the input signal;
        a first extension transistor configured to generate a first extension control signal in response to a first power supply having the first level and an inverted input signal; and
        a first output transistor coupled to a second power supply and the output node, and responsive to the first extension control signal; and
    a second level shift portion configured to pull down an output node in response to an input signal including:
        a second control transistor coupled to the second power supply and the control node, and responsive to an output signal on the output node and a second extension control signal;
        a second extension transistor configured to generate the second extension control signal in response to the first power supply having the first level and the input signal; and a second output transistor coupled to the ground and the output node, and responsive to the inverted input signal.

13. The level shifter as claimed in claim 12, wherein thicknesses of gate oxide films of the first and second extension transistors are thinner than thicknesses of gate oxide films of the first and second output transistors.

14. The level shifter as claimed in claim 12, wherein:
the first level shift portion further comprises a first compensation transistor coupled between a gate of the first output transistor and a drain of the first control transistor, and responsive to the input signal; and
the second level shift portion further comprises a second compensation transistor coupled between a gate of the second control transistor and the output node, and responsive response to the inverted input signal.

15. The level shifter as claimed in claim 12, wherein:
the first level shift portion further comprises a first deterioration prevention transistor coupled between the first and second control transistors, and coupled to a third power supply having a predetermined level; and
the second level shift portion further comprises a second deterioration prevention transistor coupled between the first and second output transistors, and coupled to the third power supply.

16. The level shifter as claimed in claim 15, wherein thicknesses of gate oxide films of the first and second control transistors are thinner than thicknesses of gate oxide films of the first and second deterioration prevention transistors.

17. The level shifter as claimed in claim 15, wherein the predetermined level is one of a first level and a second level.

18. A level shifter comprising:
a first control transistor having a source coupled to a ground and a gate to receive an input signal;
a second control transistor having a source coupled to a power supply, a drain coupled to a drain of the first control transistor, and a gate coupled to an output node;
an inverter to generate an inverted input signal in response to the input signal;
a first output transistor having a source coupled to the ground, a drain coupled to the output node, and a gate to receive the inverted input signal;
a second output transistor having a source coupled to the power supply, a drain coupled to the output node, and a gate coupled to the drain of the second control transistor;
a first extension transistor having a gate coupled to a second power supply, a drain coupled to the gate of the second control transistor, and a source coupled to the gate of the first control transistor; and
a second extension transistor having a gate coupled to the second power supply, a drain coupled to the gate of the second output transistor, and a source coupled to the gate of the first output transistor.

19. The level shifter of claim 18, further comprising:
a first auxiliary transistor having a gate coupled to the gate of the first output transistor and coupled between the gate of the second control transistor and the output node; and
a second auxiliary transistor having a gate coupled to the gate of the first control transistor and coupled between the gate of the second output transistor and the drain of the first control transistor.

20. The level shifter of claim 18, further comprising:
a first deterioration prevention transistor having a gate coupled to a third power supply and coupled between the drain of the first control transistor and the drain of the second control transistor; and
a second deterioration prevention transistor having a gate coupled to the third power supply and coupled between the drain of the first output transistor and the drain of the second output transistor.

* * * * *

UNITED STATES PATENT AND TRADEMARK OFFICE
CERTIFICATE OF CORRECTION

PATENT NO. : 7,463,064 B2
APPLICATION NO. : 11/346889
DATED : December 9, 2008
INVENTOR(S) : Seouk-Kyu Choi It is certified that error appears in the above-identified patent and that said Letters Patent is hereby corrected as shown below:

Column 8, line 66, the words "$tf_{13}$ type1" should read -- tf_type1 --.

Signed and Sealed this

Twenty-fourth Day of March, 2009

JOHN DOLL
*Acting Director of the United States Patent and Trademark Office*